United States Patent
Wieringa et al.

(10) Patent No.: US 8,961,694 B2
(45) Date of Patent: Feb. 24, 2015

(54) PLASMA GENERATOR AND METHOD FOR CLEANING AN OBJECT

(75) Inventors: Fokko Pieter Wieringa, Elst (NL); Norbertus Benedictus Koster, Delft (NL); Roland van Vliet, Aalsmeer (NL); Hubert Adriaan van Mierlo, Maassluis (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 882 days.

(21) Appl. No.: 12/520,327

(22) PCT Filed: Dec. 21, 2007

(86) PCT No.: PCT/NL2007/050696
§ 371 (c)(1),
(2), (4) Date: Sep. 16, 2009

(87) PCT Pub. No.: WO2008/075960
PCT Pub. Date: Jun. 26, 2008

(65) Prior Publication Data
US 2010/0059085 A1     Mar. 11, 2010

(30) Foreign Application Priority Data
Dec. 21, 2006    (EP) ..................................... 06077298

(51) Int. Cl.
*B08B 6/00*      (2006.01)
*B08B 3/00*      (2006.01)
*H01L 21/306*      (2006.01)
*H01J 37/32*      (2006.01)

(52) U.S. Cl.
CPC ....... *H01J 37/3266* (2013.01); *H01J 37/32357* (2013.01); *H01J 37/32623* (2013.01); *H01J 2237/335* (2013.01)
USPC ..... 134/1.1; 134/30; 156/345.48; 156/345.49

(58) Field of Classification Search
USPC ........................................ 134/18, 30, 42, 1.1; 156/345.48–345.49; 118/723 I, 723 AN
See application file for complete search history.

(56) References Cited

U.S. PATENT DOCUMENTS 4,935,661 A * 6/1990 Heinecke et al. ........ 313/231.31
5,273,609 A    12/1993 Moslehi
(Continued)

FOREIGN PATENT DOCUMENTS

DE     44 14 083 A1    10/1995
DE     4414083     * 10/1995 .............. C23C 16/50
(Continued)

OTHER PUBLICATIONS

Machine Translation, DE4414083 (Nov. 8, 2011).*
(Continued)

*Primary Examiner* — Eric Golightly
*Assistant Examiner* — Arlyn I Rivera-Cordero
(74) *Attorney, Agent, or Firm* — Fleit Gibbons Gutman Bongini & Bianco PL; Martin Fleit; Paul D. Bianco

(57) ABSTRACT

The invention relates to a plasma generator (1) for cleaning an object. The plasma generator (1) comprises a plasma chamber (2) and a support structure (6) arranged in the plasma chamber for supporting the object (7) to be cleaned. Further, the plasma generator comprises an electromagnetic shield (5a, 5b, 5c) counteracting a flow of charged plasma particles flowing from a plasma generating region towards the object, and a plasma source (8). In addition, the plasma generator comprises an additional plasma source (9,10) to form a composition of plasma sources that are arranged to generate in the plasma generating region plasmas, respectively, that mutually interact during operation of the plasma generator so as to force plasma particles to flow in a diffusely closed flow path.

20 Claims, 2 Drawing Sheets

(56) References Cited

U.S. PATENT DOCUMENTS

| | | | |
|---|---|---|---|
| 6,368,678 B1 * | 4/2002 | Bluck et al. | 427/569 |
| 7,550,927 B2 * | 6/2009 | Stowell et al. | 315/111.81 |
| 7,780,791 B2 * | 8/2010 | Sharpless et al. | 118/724 |
| 7,855,150 B2 * | 12/2010 | Laermer et al. | 438/706 |
| 2002/0185226 A1 | 12/2002 | Lea et al. | |
| 2003/0099784 A1 | 5/2003 | Schaepkens | |
| 2004/0107561 A1 | 6/2004 | Fink et al. | |
| 2005/0269199 A1 | 12/2005 | Pollak et al. | |
| 2008/0023443 A1 * | 1/2008 | Paterson et al. | 216/67 |

FOREIGN PATENT DOCUMENTS

| | | | | |
|---|---|---|---|---|
| GB | 2 387 964 A | | 10/2003 | |
| JP | 08055699 A | | 3/2008 | |
| WO | WO2004013371 | * | 2/2004 | C23C 14/00 |
| WO | WO20041013371 | * | 2/2004 | C23C 14/48 |

OTHER PUBLICATIONS

DE4414083 English Translation.*

International Search Report published Jun. 26, 2008 for PCT/NL2007/050696 filed Dec. 21, 2007.

Writen Opinion published Jun. 21, 2009 for PCT/NL07/050696 filed Dec. 21, 2007.

International Preliminary Report on Patentability published Jun. 24, 2009 for PCT/NL07/050696 filed Dec. 21, 2007.

European Search Report for European Patent No. EP06077298 dated May 3, 3007.

* cited by examiner

US 8,961,694 B2

PLASMA GENERATOR AND METHOD FOR CLEANING AN OBJECT

CROSS-REFERENCE TO RELATED APPLICATIONS

This application is a U.S. national stage application of International Application No. PCT/NL2007/050696, filed Dec. 21, 2007, which designated the United States and which claims priority of European Patent Application 06077298.5, filed Dec. 21, 2006.

FIELD OF THE INVENTION

The invention relates to a plasma generator for cleaning an object, comprising a plasma chamber, a support structure arranged in the plasma chamber for supporting the object to be cleaned, an electromagnetic shield counteracting a flow of charged plasma particles flowing from a plasma generating region towards the object, and a plasma source.

BACKGROUND OF THE INVENTION

From US patent publication US 2004/0107561 a plasma generator is known wherein the plasma source comprises a RF antenna generating a plasma, and wherein an electromagnetic shield is applied.

In general, plasma particles comprise electrons, ions and radicals. Electrons and ions are charged particles, so that the interaction with a surface to be cleaned depends on a charge distribution present at the mentioned surface. The electromagnetic shield counteracts a flow of charged plasma particles flowing towards the object, so that mainly merely radicals reach the surface to be cleaned. As radicals are electrically neutral, an electrical interaction depending on any charge distribution on the surface to be cleaned is avoided and a more reproducible and reliable cleaning operation is performed. Moreover, sputtering effects are avoided.

However, in a process of cleaning irregular 3D-structures, e.g. for medical sterilization purposes, homogeneity performances are weak. As an example, an object section near the plasma source might be etched too rigorously, while another object section located more offset to the plasma source might undergo a cleaning process that does not satisfy predetermined cleaning requirements. Obviously, such an inhomogeneity in cleaning performance might be unacceptable for certain applications.

SUMMARY OF THE INVENTION

It is an object of the invention to provide a plasma generator according to the preamble, wherein the disadvantage identified above is reduced. In particular, the invention aims at obtaining a plasma generator according to the preamble wherein a more homogeneous cleaning effect is obtained, also for irregular 3D-structures. Thereto, according to the invention, the plasma generator further comprises an additional plasma source to form a composition of plasma sources that are arranged to generate in the plasma generating region plasmas, respectively, that mutually interact during operation of the plasma generator so as to force plasma particles to flow in a diffusely closed flow path.

By providing a composition of plasma sources such that individual plasmas generated by the respective plasma sources interact so as to force plasma particles to flow in a diffusely closed flow path, a turbulent particle flow is induced and the diffusion of the radicals through the plasma generating region and the plasma chamber is improved. The radicals are induced to whirl around in the plasma chamber. As a consequence, the homogeneity of the radical spatial distribution increases, resulting in a more homogeneous cleaning effect, also for 3D-structures.

It is noted that a ratio between a penetration depth into a hole of the object to be cleaned and the diameter of that hole, also known as the aspect ratio, is a measure for the irregularity of a 3D structure. In general, if the homogeneity of cleaning radical particles increase, surfaces having a higher aspect ratio can effectively be cleaned. By using the plasma generator according to the invention, objects having a higher aspect ratio can be cleaned.

Advantageously, the plasma generator comprises a composition of three plasma sources so that a diffusely closed flow loop path can be forced. However, the plasma generator might also comprise another number of plasma sources, e.g. four or nine. When applying four plasma sources, they can e.g. be arranged to form corners of a tetrahedron to simulate a sphere.

In a preferred embodiment according to the invention, the plasma sources are arranged circularly or spherically symmetric with respect to the plasma generating region, so that a circular or spherical flow path for the plasma particles can relatively easily be defined. However, also other plasma source configurations are possible, e.g. such that plasma particles are enforced to flow in an ellipsoidal diffusely closed flow path.

By sequentially starting operation of the individual plasma sources, enforcement of flowing radical plasma particles in the diffusely closed flow path is facilitated, as the flowing particles are sequentially redirected. In general, pulsed activation of plasma sources causes pressure waves in the plasma chamber, thereby advantageously diffusing the plasma particles. Alternatively, mutual interaction of the individual plasma leading to a plasma particle closed path flow might also be obtained by operating the individual plasma sources otherwise, e.g. by dynamically manipulating a gas injection flow.

Further, by generating the plasmas in a pulsed manner, the cleaning effect of the radical plasma particles is enhanced, so that surfaces having even higher aspects ratios can be treated. In principle, however, the plasmas can also be generated in a continuous way, thereby reducing driving electronics of the plasma generator.

The invention also relates to a method for cleaning an object.

Other advantageous embodiments according to the invention are described in the following claims.

BRIEF DESCRIPTION OF THE DRAWINGS

By way of example only, embodiment of the present invention will now be described with reference to the accompanying figure in which.

It is noted that the figures show merely preferred embodiments according to the invention. In the figures, the same reference numbers refer to equal or corresponding parts.

DETAILED DESCRIPTION OF THE INVENTION

Figure 1:
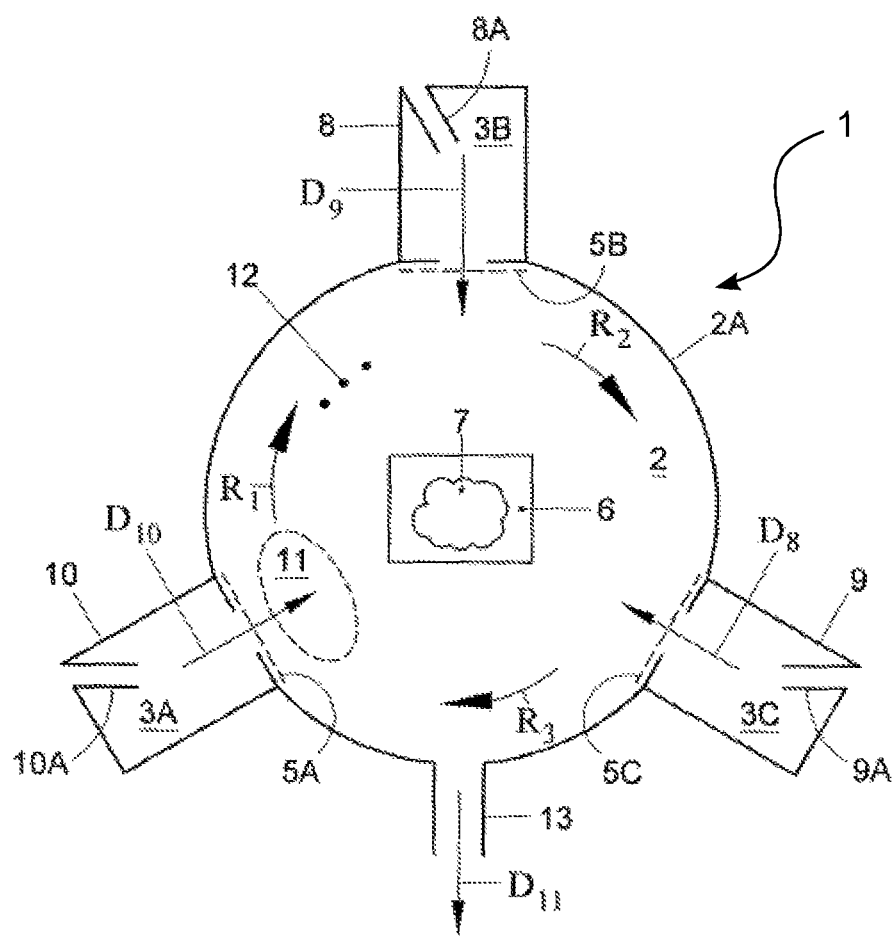
FIG. 1 shows a plasma generator according to a first embodiment of the invention.

FIG. 1 shows a first embodiment of a plasma generator 1 according to the invention. The plasma generator 1 is provided with a reduced pressure plasma chamber 2 having chamber walls 2A. The plasma chamber 2 is operated at pressure substantially in a range ranging between circa 0.01 mbar and circa 100 mbar. As an example, the pressure in the plasma chamber is substantially 1 mbar.

In the plasma chamber 2 a support structure is placed, such as a table 6. On the table 6 an object 7, such as a medical surgical instrument, to be cleaned, is located. By using the plasma generator 1 according to the invention, the cleaning and sterilizing process medical instruments is simplified considerably compared with prior art manual cleaning processes.

Further, the plasma generator 1 comprises a composition of three plasma sources 8, 9, 10 that are arranged in apertures of the chamber wall 2A. During operation of the plasma generator 1, the plasma sources 8, 9, 10 generate respective plasmas in plasma generating sections 3A, 3B, 3C. In particular, the generator 1 is provided with a plasma source 8, an additional plasma source 9 and a further plasma source 10 forming the composition of three plasma sources 8, 9, 10. Each plasma source 8, 9, 10 injects the respective plasma in a diffusive direction $D_8$, $D_9$, $D_{10}$ into the plasma chamber 2. The plasma generating sections 3A, 3B, 3C are closed by an electromagnetic shield 5A, 5B, 5C to avoid that net charge carrying plasma particles enter the plasma chamber 2. A further effect of the electromagnetic shield is that the electromagnetic load for the plasma sources 8, 9, 10 remains substantially constant over time and is substantially independent of the object load, thereby avoiding tuning problems of the plasma sources.

Further, the plasma chamber 2 is provided with an outlet port 13 for removing material in an outlet port direction $D_{11}$ to maintain optimal reduced pressure circumstances.

The plasma sources 8, 9, 10 are sequentially driven in a pulsed manner to enhance the aspect ratio performance of the plasma generator 1. In FIG. 1, a radical particle plasma cloud 11 is depicted that is generated during a pulse operation of a plasma source 10. Due to the injection direction $D_{10}$ caused by the generating plasma source 10, the radical particle plasma cloud 11 flows substantially in a flowing direction $R_1$ of another plasma source 8 located clockwise with respect to the plasma source 10 that generated the plasma cloud 11. Upon arrival of the radical particle cloud 11 near the clockwise next plasma source 8, the latter is pulse activated to generate a plasma that interacts with the radical particle plasma cloud 11 to force the particles in the radical particle plasma cloud 11 in a flowing direction $R_2$ towards the clockwise next plasma source 9. A similar process is repeated so that the radical particle plasma cloud 11 is directed to the earlier described plasma source 10 via a flowing direction $R_3$. Thus, by the switching operation of the plasma sources 8, 9, 10 the plasma particles are forced to flow in a substantially circular diffusely closed and turbulent flow path defined by the flowing directions $R_1$, $R_2$, $R_3$.

It is noted that by applying a sequentially starting operation of the plasma sources, temporarily local pressure differences are created, thus inducing the plasma particles to follow the flow path. Hence, a looped pressure wave can be created.

By following the diffusive flow path individual particles of the plasma, such as radical particles, are turbinated, stirred and/or diffused, so that a relatively homogenous spatial distribution of radical particles is obtained in the plasma generation section 3. It is noted that the circulation velocity of the radical particle plasma cloud 11 may vary and depends on a pulse period of plasma source activation and on frequency of subsequent plasma source activation. As an example, such a pulse frequency is in the order of seconds or even milliseconds, tens of microseconds or longer. In general, the diffusion effect of individual radical plasma particles according to the invention improves if the circulation velocity of the radical particle plasma cloud 11 increases.

It is noted that the diffusely closed flow path can be in a two-dimensional space, thus describing e.g. a circle, or in a three-dimensional space, thus describing e.g. a sphere The radical particles perform a cleaning operation on the object 7. In general, radical plasma particles efficiently remove bacterial, viruses, prions, yeasts, pyrogens and other organic material.

As described above, the operation of an individual plasma source 10 is terminated before the operation of a subsequent individual plasma source 8 is started. However, in principle, the operation of individual plasma sources might overlap, e.g. for optimizing the production of plasma particles.

According to an advantageous aspect of the invention, the sequence order of starting operation of the individual plasma sources can change over time. As an example, during some period the plasma sources are started in a clockwise direction, while in a subsequent period the plasma sources are started in a counter clockwise direction, thereby even more diffusing and/or stirring the plasma particles. Inverting the sequence of starting the individual plasma sources significantly improves the diffusing character of the plasma cloud. Alternatively, the sequence order of starting operation of the individual plasma sources remains constant over time.

The individual plasma sources 8, 9, 10 are provided with introducing elements for providing material for the plasma as well as means for generating the plasma. In principle, many variants are possible. In a first embodiment, a liquid, such as hydrogen peroxide is introduced through an ultrasonic atomizer. In a second embodiment, a volume of liquid or frozen material, such as hydrogen peroxide is evaporized by means of a laser, such as an infrared Er:Yag laser at 2940 nm or a deep UV fluorine laser at 157 nm. During operation of the plasma source a controlled gas flow is injected, such as oxygen or hydrogen, while simultaneously electromagnetic excitation occurs. Preferably, a microwave excitation is applied. However, also other excitations are possible, such as RF waves or DC voltages.

The introducing element is implemented as an inlet port 8A, 9A, 10A. In order to facilitate the introduction of a pre-determined amount of material, the inlet ports 8A, 9A, 10A can be provided with first and second closing elements near both ends of the inlet ports. By driving the inlet elements such that always at least one closing element is in a closed state, the amount of material to be introduced can be set relatively accurately. By using a laser as described above, the obtainable pulse frequency can be raised due to electronic activation of the device instead of mechanical displacements.

It is noted that a very steep pressure gradient in the plasma chamber is achieved by laser evaporization in combination with microwave excitation. By providing sequential steep pulse gradients a pressure plasma cloud wave might be created. By using steep, narrow pulses having a relatively large interval, a highly diffusive spatial distribution of radical particles can be realized, while a low overall mean pressure can be obtained.

Optionally, an introducing element in the plasma source is time scheduled in a pulsed way for providing the pulsed behaviour of the plasma source. The pulsed behaviour of the material flow or injected gas flow can be synchronously with the excitation, but may also deviate from the excitation time schedule. Preferably, the pulsed behaviour of the injected material anticipates the excitation, thereby stimulating an explosion effect of the plasma particles, so that an even further diffusion of radical plasma particles is obtained leading to a more homogeneous spatial radical particles distribution.

Further, the time schedule of the gas injection and the excitation may be set by a user of the plasma generator.

As a further option, the support structure is connected to a voltage power source delivering a positive electrical potential, so that a desired potential can be obtained on the support structure, thereby avoiding that electrically charged particles having penetrated the electromagnetic shield reach the object to be cleaned.

Figure 2:
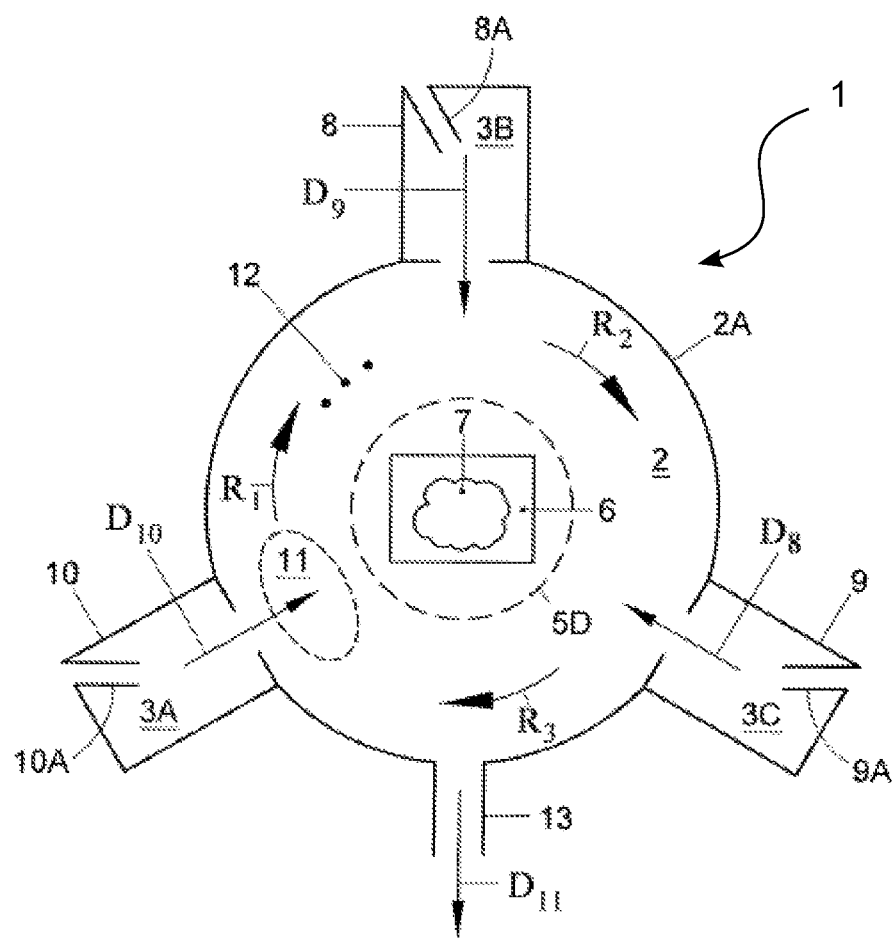
FIG. 2 shows a plasma generator according to a second embodiment of the invention.

FIG. 2 shows a second embodiment of a plasma generator 1 according to the invention. Here, the electromagnetic shields 5A, 5B, 5C have been replaced by a single electromagnetic shield 5D surrounding the support structure 6 supporting the object 7 to be cleaned. From radial outer regions of the plasma chamber, a part of the particles in the plasma cloud 11 that in this embodiment also contains electrically charged particles, travels towards the object 7 to be cleaned. The electromagnetic shield 5 counteracts a flow of charged plasma particles, such as ions and electrons, to flow towards the object 7, so that substantially merely radical particles, or at least a relatively high concentration of radical particles, reach the object 7 and perform a cleaning operation.

The invention is not restricted to the embodiments described herein. It will be understood that many variants are possible.

Instead of using the plasma generator for cleaning medical devices, the plasma generator can also be used for cleaning other structures, such as wafer surfaces, or complex assemblies intended for UHV applications.

Further, in principle, the idea of interacting individual plasmas to enforce a particle plasma flow in a diffusely closed flow path can also be performed in an atmospheric plasma chamber.

Other such variants will be obvious for the person skilled in the art and are considered to lie within the scope of the invention as formulated in the following claims.

The invention claimed is:

1. A method for cleaning an object using plasma, comprising the steps of:
    placing the object on a support structure in a chamber;
    generating plasma from at least three plasma sources;
    sequentially starting operation of adjacent ones of the at least three plasma sources using a sequential timer, the timer configured to cause the at least three plasma sources to generate plasma in a phased sequence relative to each other, in order to produce a looping flow path; and
    blocking the flow of charged plasma particles from contacting the object.

2. A method for cleaning an object using a plasma generator, comprising the steps of:
    placing the object on a support structure in a plasma chamber;
    providing an electromagnetic shield disposed between a plasma generator and the object to thereby block a flow of charged plasma particles flowing from the plasma generator towards the object;
    generating plasma in the plasma chamber using at least three plasma generators; and
    sequentially starting operation of adjacent ones of the at least three plasma sources to promote a circular closed flow path.

3. The method according to claim 2, the sequential starting further comprising terminating operation of an individual plasma source before starting operation of a subsequent individual plasma source.

4. The method according to claim 2, wherein sequentially starting includes generating the plasmas in a pulsed manner.

5. The method according to claim 2, wherein a plasma source is operated during a period in the order of tens of microseconds to hundreds of milliseconds.

6. The method according to claim 2, wherein sequentially starting generates a radical particle plasma cloud travelling along a diffusely closed flow path, wherein radical plasma particles are emitted throughout the shield to thereby clean the object.

7. The method according to claim 2, wherein sequentially starting creates a local pressure difference at each plasma generating region, thereby forming a closed flow path having the form of a looped pressure wave.

8. A plasma device for cleaning an object, comprising:
    an object supporting chamber;
    at least three plasma generators disposed in mutually spaced relationship about the chamber;
    a timer scheduler configured to sequentially activate adjacent ones of the at least three plasma generators to cause plasma particles to flow in a looped flow path;
    an electromagnetic shield disposed between the plasma generators and the object to be cleaned, to thereby block a flow of charged plasma particles and admit passage of radicals flowing from the plasma generators towards the object.

9. A plasma generator for cleaning an object, comprising:
    a plasma chamber;
    a support structure arranged in the plasma chamber for supporting the object to be cleaned;
    an electromagnetic shield formed as a mesh counteracting a flow of charged plasma particles flowing from a plasma generating region towards the object;
    a plurality of plasma sources; and
    a timer connected to each of the plurality of plasma sources, the timer configured to sequentially activate successive adjacent plasma sources to thereby cause radical plasma particles to flow in a looped diffusely closed flow path.

10. A plasma generator according to claim 9, wherein the electromagnetic shield is located between the plurality of plasma sources and the object to be cleaned.

11. A plasma device for treating an object with plasma, comprising:
    an object treatment chamber having an interior for containing the object to be treated;
    at plurality of plasma generators disposed in mutually spaced relationship about a periphery of the chamber, each plasma generator having an outlet into the object treatment chamber;
    a plurality of electrical input sources each connected to a plasma generator;
    a timer connected to the input sources and configured to sequentially cause adjacent ones of the plurality of plasma generators to produce plasma in a sequence relative to each other, to cause plasma to flow in a loop about the chamber interior;
    an electromagnetic shield disposed within a plasma flow path between the plasma generator outlets and the object to thereby block a flow of charged plasma particles and admit passage of radicals flowing from the plasma generators towards the object.

12. The plasma device of claim 11, wherein the electromagnetic shield forms an enclosed periphery about the object when the object is placed within the object treatment chamber.

13. A plasma generator for cleaning an object, comprising:
a plasma chamber;
a support structure arranged in the plasma chamber for supporting the object to be cleaned;
an electromagnetic shield formed as a mesh counteracting a flow of charged plasma particles flowing from a plasma generating region towards the object;
a plurality of plasma sources; and
a timer configured to sequentially start successive adjacent ones of the plurality of plasma sources to thereby force plasma particles to flow in a looped diffusely closed flow path.

14. The plasma generator according to claim 13, the the timer configured for sequentially starting operation of the plurality of plasma sources in a clockwise or counter-clockwise order.

15. The plasma generator according to claim 13, wherein the plurality of plasma sources are arranged circularly or spherically symmetric with respect to the plasma generating region.

16. The plasma generator according to claim 13, wherein the electromagnetic shield surrounds the support structure.

17. The plasma generator according to claim 13, wherein the plasma chamber has a chamber wall, and wherein the plurality of plasma sources are each arranged to inject plasma through respective apertures in the chamber wall into the plasma chamber.

18. The plasma generator according to claim 13, wherein the electromagnetic shield admits radicals which may pass to the surface of the object to be cleaned.

19. The plasma generator according to claim 13, wherein at least one of the plurality of plasma sources is provided with an introducing element for providing material for generating plasma, wherein the introducing element is arranged to operate in a pulsed manner.

20. The plasma generator according to claim 19, wherein the introducing element is provided at an introducing port in communication with the plasma chamber.

* * * * *